US012699818B2

(12) United States Patent
Brooks

(10) Patent No.: US 12,699,818 B2
(45) Date of Patent: Aug. 4, 2026

(54) PARALLEL EMULATION FOR CONTROLS TESTING

(71) Applicant: Rockwell Automation Technologies, Inc., Mayfield Heights, OH (US)

(72) Inventor: Bernard Brooks, Workingham (GB)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 1010 days.

(21) Appl. No.: 17/823,155

(22) Filed: Aug. 30, 2022

(65) Prior Publication Data

US 2024/0070345 A1     Feb. 29, 2024

(51) Int. Cl.
*G06F 30/20* (2020.01)

(52) U.S. Cl.
CPC ................................... *G06F 30/20* (2020.01)

(58) Field of Classification Search
CPC ....................................................... G06F 30/20
USPC ............................................................. 703/6
See application file for complete search history.

(56) References Cited

U.S. PATENT DOCUMENTS

| | | | |
|---|---|---|---|
| 2011/0191092 A1* | 8/2011 | Mizrachi | G06F 30/00 |
| | | | 718/104 |
| 2019/0018916 A1* | 1/2019 | Benedikt | G06F 30/33 |
| 2022/0100917 A1* | 3/2022 | McGregor | G05B 19/41885 |

FOREIGN PATENT DOCUMENTS

| | | |
|---|---|---|
| EP | 3 974 920 A1 | 3/2022 |
| WO | 03/017099 A1 | 2/2003 |

OTHER PUBLICATIONS

Rueckert_2020 (Human-in-the-loop simulation for virtual commissioning of human-robot-collaboration, 13th CIRP Conference on Intelligent Computation in Manufacturing Engineering, CIRP ICME '19 ). (Year: 2020).*
Extended European Search Report received for European Patent Application Serial No. 23184127.1 dated Feb. 9, 2024, 10 pages.

* cited by examiner

*Primary Examiner* — Brian S Cook
(74) *Attorney, Agent, or Firm* — Amin, Turocy & Watson, LLP

(57) ABSTRACT

A control design and testing system simplifies the execution of parallelized control testing simulators using emulation techniques. The system is capable of emulating large and complex industrial systems using a combination of selective model partitioning, space parallel simulation, and co-simulation. According to this approach, a digital model of the industrial automation system is partitioned into sub-models such that inter-model logical relationships between the sub-models comprise only logical relationships that can tolerate a temporal error equal to or less than a duration, or timestep, of a co-simulation cycle. The sub-models are deployed to separate processing spaces, and the system uses co-simulation to execute a parallel emulation of the sub-models.

20 Claims, 13 Drawing Sheets

SIMULATED OUTPUTS

OPERATION ANIMATION
PRODUCT FLOW
OPERATING STATISTICS
· · ·

108

USER INPUTS

CONTROL COMMANDS
PROGRAM MODIFICATIONS
MODEL MODIFICATIONS
· · ·

110

SIMULATION PLATFORM

SYSTEM MODEL

CONTROL PROGRAM

106

104

102

302

304

306

CLASSICAL SIMULATION

PARALLEL SIMULATION

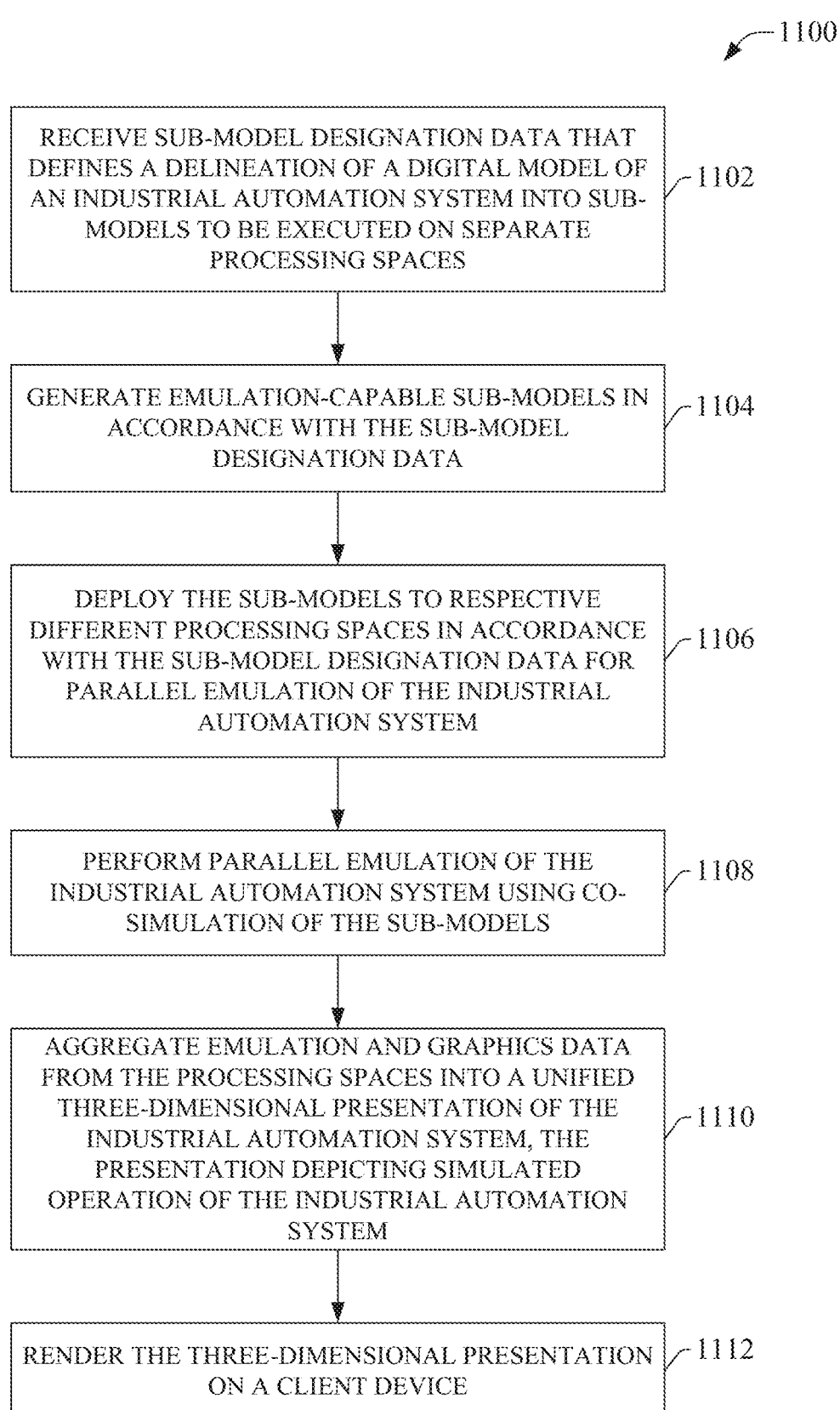

RECEIVE SUB-MODEL DESIGNATION DATA THAT DEFINES A DELINEATION OF A DIGITAL MODEL OF AN INDUSTRIAL AUTOMATION SYSTEM INTO SUB-MODELS TO BE EXECUTED ON SEPARATE PROCESSING SPACES ⌐1102

GENERATE EMULATION-CAPABLE SUB-MODELS IN ACCORDANCE WITH THE SUB-MODEL DESIGNATION DATA ⌐1104

DEPLOY THE SUB-MODELS TO RESPECTIVE DIFFERENT PROCESSING SPACES IN ACCORDANCE WITH THE SUB-MODEL DESIGNATION DATA FOR PARALLEL EMULATION OF THE INDUSTRIAL AUTOMATION SYSTEM ⌐1106

PERFORM PARALLEL EMULATION OF THE INDUSTRIAL AUTOMATION SYSTEM USING CO-SIMULATION OF THE SUB-MODELS ⌐1108

AGGREGATE EMULATION AND GRAPHICS DATA FROM THE PROCESSING SPACES INTO A UNIFIED THREE-DIMENSIONAL PRESENTATION OF THE INDUSTRIAL AUTOMATION SYSTEM, THE PRESENTATION DEPICTING SIMULATED OPERATION OF THE INDUSTRIAL AUTOMATION SYSTEM ⌐1110

RENDER THE THREE-DIMENSIONAL PRESENTATION ON A CLIENT DEVICE ⌐1112

FIG. 11

PARALLEL EMULATION FOR CONTROLS TESTING

BACKGROUND

The subject matter disclosed herein relates generally to industrial automation systems, and, more specifically, to digital simulations of industrial systems.

BACKGROUND ART

While single-threaded simulation tools are capable of simulating relatively small automation systems comprising a single industrial controller, these tools lack sufficient processing and memory capacity to accurately simulate larger automation systems, which may comprise multiple interconnected machines or conveyors that are monitored and controlled by multiple industrial controllers. To simulate these larger systems, designers can simplify the system model so that the simulation does not exceed the processing limits of the simulation tool. However, the loss of model fidelity as a result of simplifying the model may yield less accurate simulation results.

As an alternative solution, users may divide the automation system model into sub-models and execute the sub-models in separate simulation instances using space parallel simulation. However, managing these separate simulations and the data flows between them can be cumbersome, and also makes it difficult to visualize the aggregate simulated system as a whole.

The above-described issues are merely intended to provide an overview of some of the problems of current technology and are not intended to be exhaustive. Other problems with the state of the art, and corresponding benefits of some of the various non-limiting embodiments described herein, may become further apparent upon review of the following detailed description.

BRIEF DESCRIPTION

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one or more embodiments, a system for emulating industrial automation systems is provided, comprising partitioning component configured to partition a digital model of an industrial automation system into sub-models based on sub-model designation data that defines a partitioning of the digital model; model deployment component configured to deploy the sub-models to respective processing spaces; and a simulation component configured to perform a parallel emulation of the sub-models on the respective processing spaces using co-simulation.

Also, one or more embodiments provide a method for emulating industrial automation systems, comprising delineating, by a system comprising a processor, a digital model of an industrial automation system into sub-models in accordance with sub-model designation data that defines a division of the digital model; deploying, by the system, the sub-models to respective separate processing spaces; and performing, by the system, a parallel emulation of the sub-models on the respective separate processing spaces using co-simulation.

Also, according to one or more embodiments, a non-transitory computer-readable medium is provided having stored thereon instructions that, in response to execution, cause a system to perform operations, the operations comprising dividing a digital model of an industrial automation system into sub-models in accordance with sub-model designation data that defines a partitioning of the digital model; deploying the sub-models to respective separate processing spaces; and performing a parallel emulation of the sub-models on the respective separate processing spaces using co-simulation.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

FIG. 11 is a flowchart of an example methodology for executing a parallel emulation of an industrial automation system.

DETAILED DESCRIPTION

Figure 1:
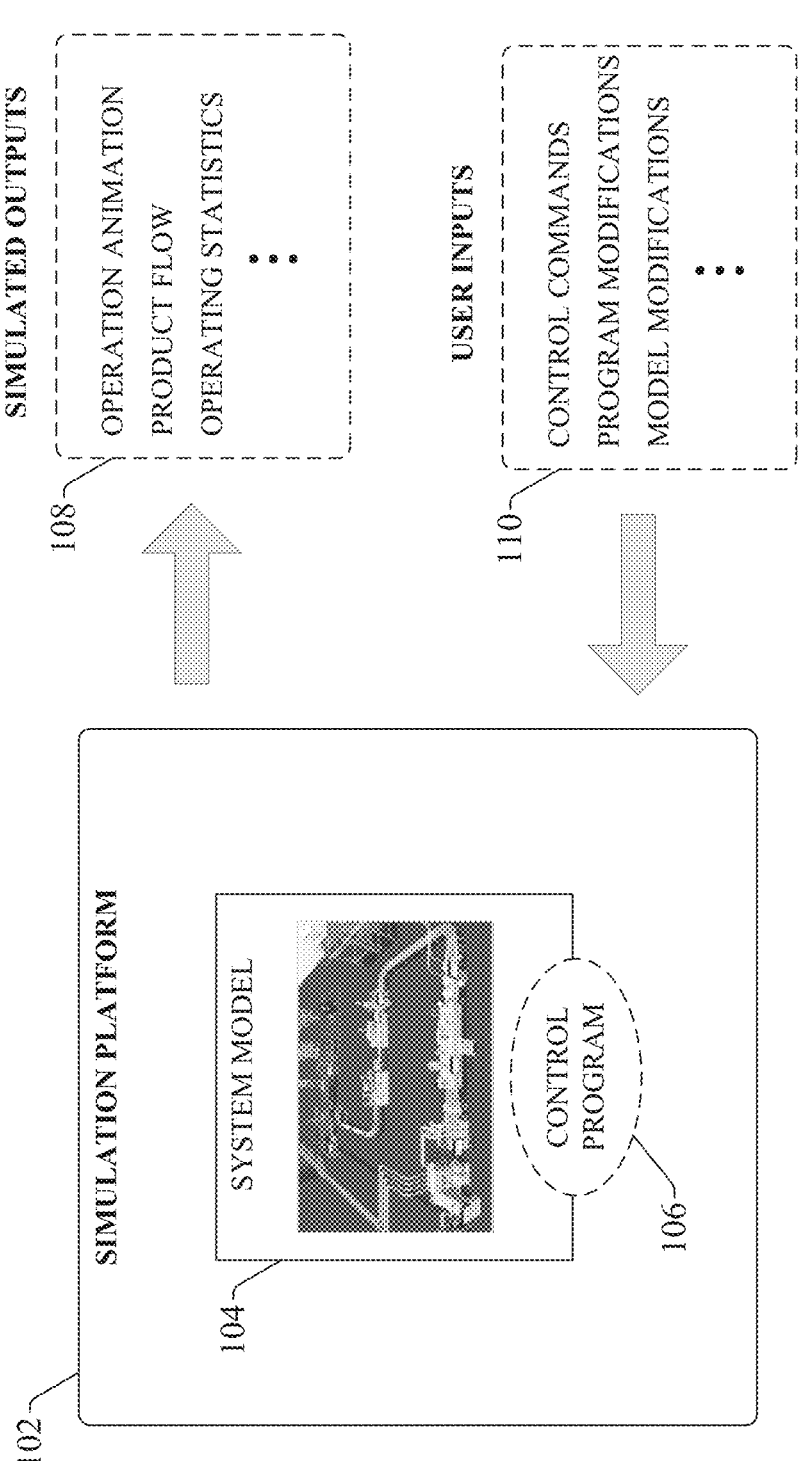
FIG. 1 is a diagram illustrating simulation of a digital system model of an automation system at a high level.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

At a high level, designing a new industrial automation or control system typically involves two interrelated engineering efforts to develop the mechanical aspects on one hand and control aspects on the other. Mechanical engineering may involve selecting or designing the machines and related components that will make up the new system (e.g., industrial robots, machining stations, conveyors, operator workstations, motion devices, motors, pneumatic actuators, etc.), determining suitable locations and orientations of these machines, selecting and locating sensors that will be used to feed status and operating data to the control devices, etc. Based on this mechanical design, controls engineers design the electrical system for both power and data connectivity, develop control code (e.g., ladder logic, sequential function charts, function block diagrams, structured text, etc.) to be executed by one or more industrial controllers to monitor and control operation of the automation system, set device configurations (e.g., motor drive parameter settings), and develop human-machine interfaces (HMIs) for visualizing machine statuses and alarms.

As part of the design and testing process, controls engineers may also execute digital simulations that virtually test operation of the mechanical system under control of the control program. FIG. 1 is a diagram illustrating simulation of a digital system model 104 of an automation system at a high level. The system model 104 (e.g., a digital twin or another type of simulation-capable digital model) is a virtual representation of the automation system, defining the mechanical components and devices that make up the system, as well as the physics and behavioral properties of those components. The model 104 can also define the behaviors of materials, objects, or products that are manufactured, handled, or conveyed by the automation system.

The model 104 and a copy of the industrial control program 106 that will be executed on an industrial controller to monitor and control the physical system can be imported into a simulation platform 102, which runs a simulation based on the system model 104 and the control program 106. The simulation platform 102 uses the model 104 and the control program 106 to simulate operation of the physical automation system under the control of the control program 106 in order to test the control programming and the mechanical design, a process referred to as virtual commissioning.

The simulation platform 102 can virtually mimic the behavior of the automation system's mechanical assets and product flows in response to execution of the control program 106 on an emulated industrial controller so that proper operation can be verified. During or after the simulation, the platform 102 can render simulated outputs 108 that convey simulated system behaviors to the user, including but not limited to graphical animations of system operation—which can include animations of the product or material flow through the system—and simulated operating statistics (e.g., speeds, product throughputs, incidences of product or machine collisions, etc.). The user may also submit inputs 110 to the simulation, including simulated control commands representing operator interactions with the physical automation system (e.g., interaction with control panel devices such emergency stop buttons or selector switches; manual placement or removal of units of product, etc.). Based on observed simulated system behaviors, the user may also submit modifications to the control program 106, or to the system model 104 itself, in order to bring the predicted system behaviors within desired operating requirements. Upon completion of virtual commissioning, the automation system can be physically commissioned by building the system in accordance with the system model 104 (in the case of a new installation) and installing the control program 106 on the associated industrial controller.

While single-threaded simulation tools are capable of simulating relatively small automation systems comprising a single industrial controller, these tools lack sufficient processing and memory capacity to accurately simulate larger automation systems, which may comprise multiple interconnected machines or conveyors that are monitored and controlled by multiple industrial controllers. To simulate these larger systems, designers can simplify the system model 104 so that the simulation does not exceed the processing limits of the simulation tool. However, the loss of model fidelity as a result of simplifying the model 104 may yield less accurate simulation results. Moreover, the modifications applied to the model 104 may necessitate modification of the control program 106, and as a result the program 106 being tested within the simulation platform 102 will be different than the program that will be commissioned to the physical controller, resulting in further testing inaccuracies.

As an alternative solution, users may divide the model 104 into sub-models and execute the sub-models in separate simulation instances using space parallel simulation. However, managing these separate simulations and the data flows between them can be cumbersome, and also makes visualization of the aggregate simulated system as a whole difficult. Moreover, in classical parallel simulation the timing of simulated execution of events that originate in one model partition and affect other partitions is crucial and must be precisely managed.

To address these and other issues, one or more embodiments of the present disclosure provide a control design and testing system that simplifies the execution of parallelized control testing simulators using emulation techniques. The design and testing system is capable of emulating large and complex industrial systems using a combination of selective model partitioning, space parallel simulation, and co-simulation. According to this approach, a digital model of the industrial automation system is partitioned into sub-models such that inter-model logical relationships between the sub-models comprise only logical relationships that can tolerate a temporal error equal to or less than a duration, or timestep, of a co-simulation cycle. The sub-models are deployed to separate processing spaces, and the system uses co-simulation to execute a parallel emulation of the sub-models.

Figure 2:
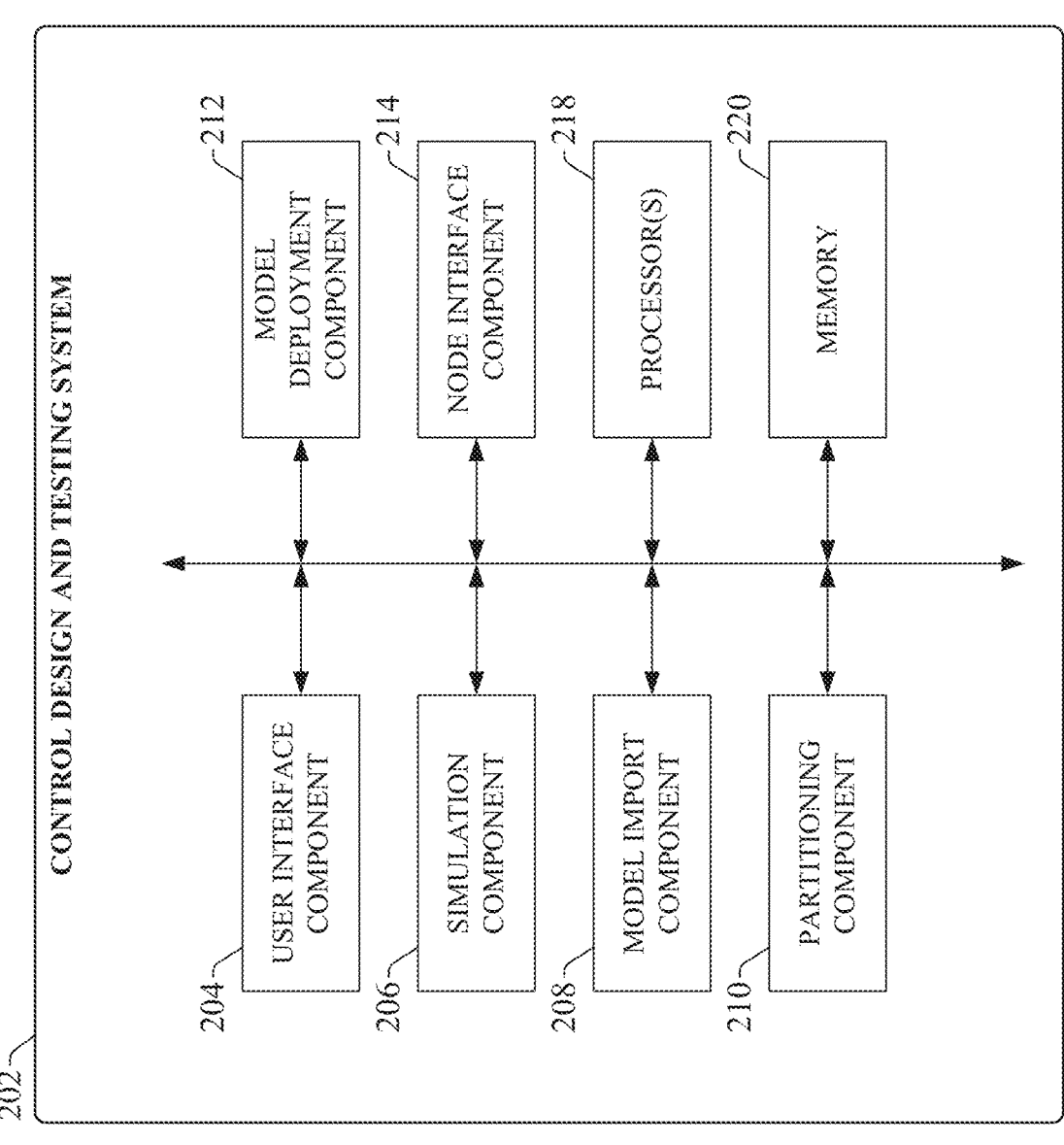
FIG. 2 is a block diagram of an example control design and testing system.

FIG. 2 is a block diagram of an example control design and testing system 202 according to one or more embodiments of this disclosure. Aspects of the systems, apparatuses, or processes explained in this disclosure can constitute machine-executable components embodied within machine (s), e.g., embodied in one or more computer-readable mediums (or media) associated with one or more machines. Such components, when executed by one or more machines, e.g., computer(s), computing device(s), automation device(s), virtual machine(s), etc., can cause the machine(s) to perform the operations described.

Control design and testing system 202 can include a user interface component 204, a simulation component 206, a model import component 208, a partitioning component 210, a model deployment component 212, a node interface component 214, one or more processors 218, and memory 220. In various embodiments, one or more of the user interface component 204, simulation component 206, model import component 208, partitioning component 210, model deployment component 212, node interface component 214, the one or more processors 218, and memory 220 can be electrically and/or communicatively coupled to one another to perform one or more of the functions of the design and testing system 202. In some embodiments, components 204, 206, 208, 210, 212, and 214 can comprise software instructions stored on memory 220 and executed by processor(s) 218. Design and testing system 202 may also interact with other hardware and/or software components not depicted in FIG. 2. For example, processor(s) 218 may interact with one or more external user interface devices, such as a keyboard, a mouse, a display monitor, a touchscreen, or other such interface devices.

User interface component 204 can be configured to receive user input and to render output to a user in any suitable format (e.g., visual, audio, tactile, etc.). In some embodiments, user interface component 204 can render interactive display screens on a display device (e.g., a display device associated with a desktop computer, a laptop computer, a tablet computer, a smart phone, etc.), where the display screens serve as the interface for an emulation platform. The user interface can display virtual 3D emulations of automation systems being tested against an industrial control program, render operational statistics representing expected performance of the automation system based on the simulation, and other such information. In some embodiments, the user interface component 204 can also render selectable design tools and receive design input via interaction with the tools in connection with configuring aspects for the industrial automation (e.g., I/O connectivity between devices of the virtual system and an industrial controller).

Simulation component 206 can be configured to simulate operation of a virtualized model of an industrial automation system under control of an industrial control program. In particular, the simulation component 206 can use co-simulation techniques to parallelize emulation of separate partitions of the model.

Model import component 208 can be configured to import a simulation-capable digital model of an automation system to be partitioned and simulated using parallel emulation. Partitioning component 210 can be configured to partition the model in accordance with partition designation data submitted by a user, or based on an analysis of the model to identify a suitable partitioning that yields sub-models that can be collectively emulated using co-simulation.

Model deployment component 212 can be configured to deploy the sub-models generated by the partitioning component 210 to respective different processing nodes to facilitate parallel emulation of the model by the simulation component 206. The node interface component 316 can be configured to aggregate graphics and simulation data from the distributed processing nodes into a unified three-dimensional presentation of the simulated automation system.

The one or more processors 218 can perform one or more of the functions described herein with reference to the systems and/or methods disclosed. Memory 220 can be a computer-readable storage medium storing computer-executable instructions and/or information for performing the functions described herein with reference to the systems and/or methods disclosed.

Figure 3:
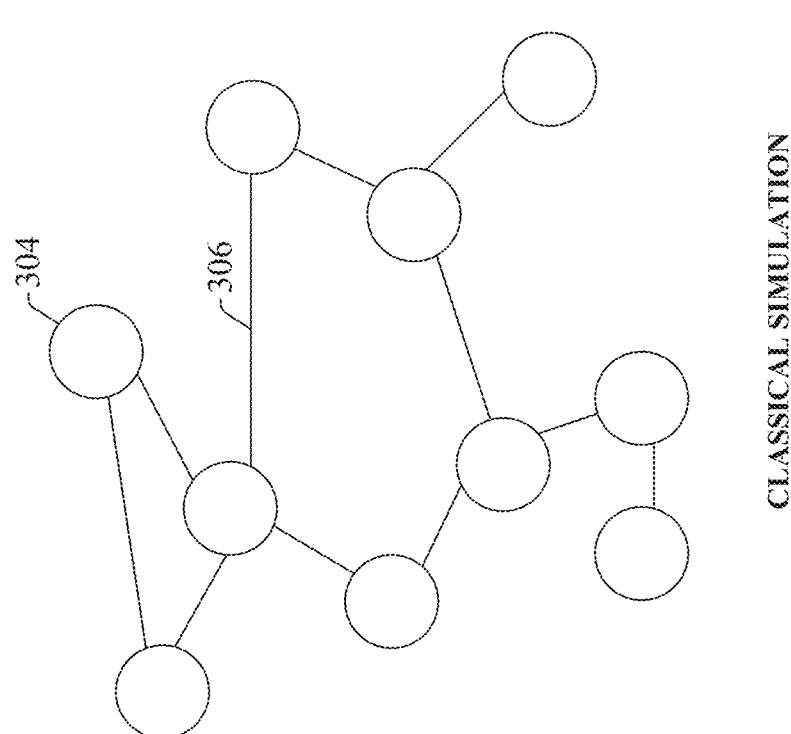
FIG. 3 is representation of a digital model of an automation system that can be simulated using classical simulation.

As noted above, embodiments of design and testing system 202 can simulate large automation systems using parallel emulation techniques—to be described in more detail below—to overcome limitations of classical parallel simulation. FIG. 3 is representation of a digital model 302 of an automation system that can be simulated using classical simulation. In general, a simulation tool that supports classical simulation defines the digital model 302 as a set of mathematical representations of real-world objects 304—e.g., mechanical components, conveyors, robot axes, motors, etc.—and the logical relationships 306 or connections between those objects 304. These logical relationships 306 can represent data exchanges between the real-world components, mechanical or physical relationships between components, event-based relationships, or other such logical relationships.

Figure 4:
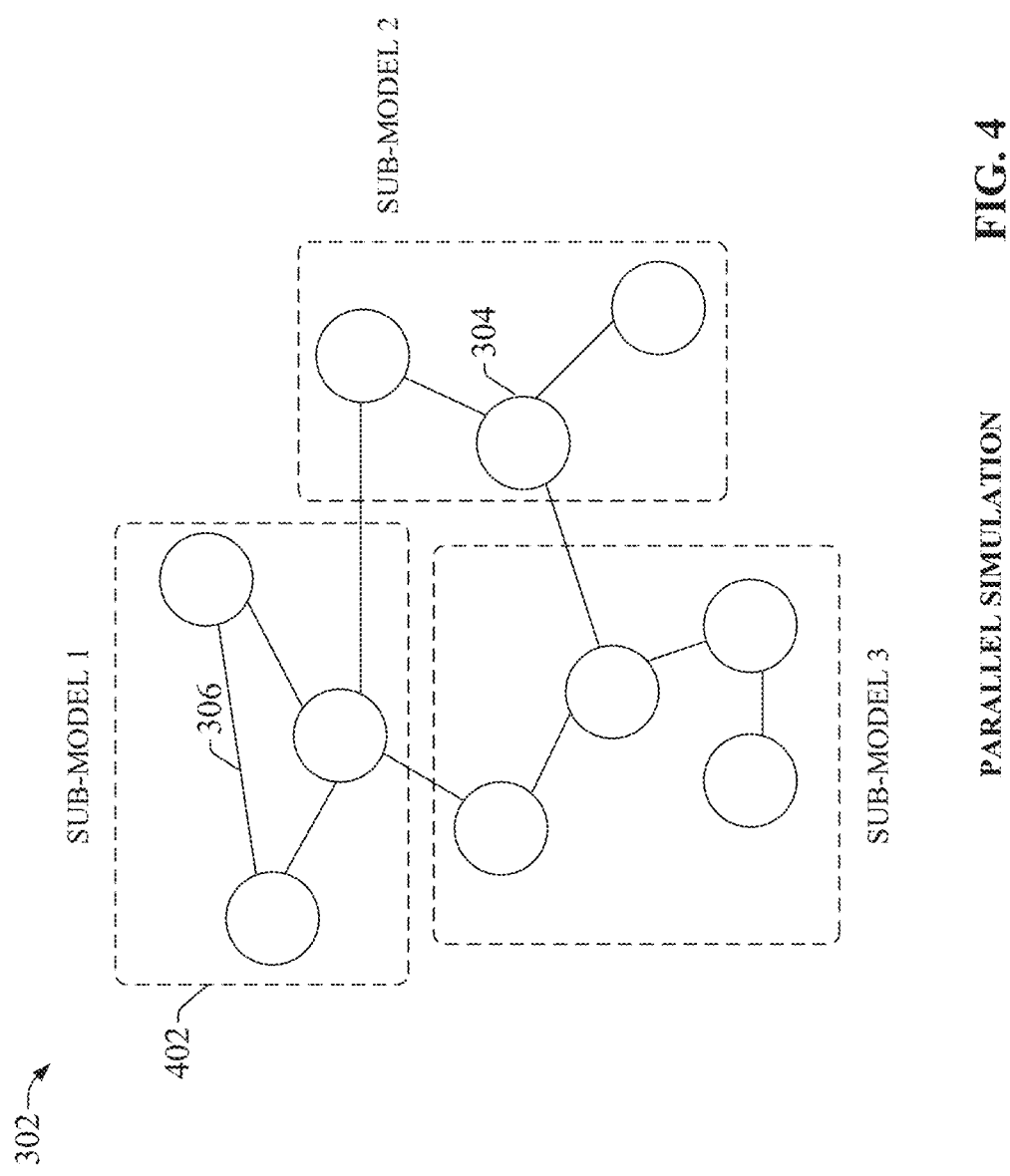
FIG. 4 is a representation of the digital model illustrating an example partitioning of model for parallel simulation.

To reduce execution latency for simulations of large automation systems, the model 302 can be partitioned and the resulting sub-models can be executed on separate processors, an approach referred to as parallel simulation. FIG. 4 is a representation of the digital model 302 illustrating an example partitioning of model 302 for parallel simulation. According to parallel simulation, the model 302 is divided into smaller sub-models 402, and the sub-models 402 are simulated autonomously on separate processors acting as discrete event simulators. During the parallel simulation, the separately executed simulations exchange event data as needed in accordance with the logical relationships 306. This can include simulated exchange of data between data generators and consumers (representing data exchange between the corresponding physical devices) as well communication of events that occurs in one sub-model 402 that affect the behavior of another sub-model 402 (e.g., detection of a product on a conveyor by a sensor, pressing of an emergency stop button by an operator, etc.).

Figure 5:
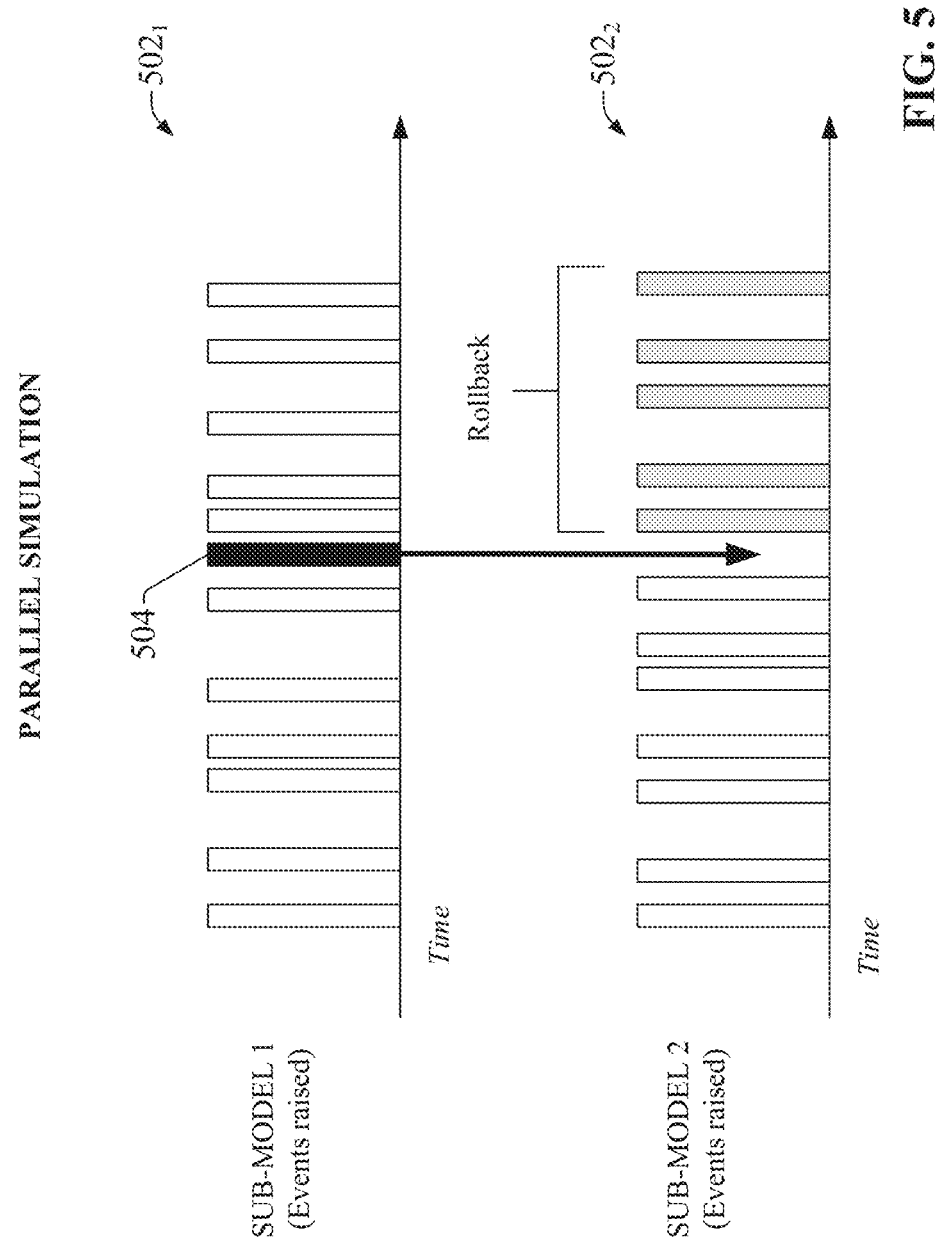
FIG. 5 is a pair of timing diagrams illustrating timings of simulated events that occur on respective two sub-models during parallel simulation of the sub-models.

FIG. 5 is a pair of timing diagrams 502₁ and 502₂ illustrating timings of simulated events (represented by vertical bars) that occur on respective two sub-models 402 during parallel simulation of the sub-models 402. In this example, the two sub-models 402—sub-model 1 and sub-model 2—have at least one logical relationship 306. That is, certain simulated events that are raised in sub-model 1—such as event 504—affect the simulated operation of one or more objects 304 in sub-model 2. Simulated event 504 may represent a real-world event that occurs within the portion of the automation system represented by sub-model 1, and that is detected by, and affects the behavior of, another portion of the automation system represented by sub-model 2. Event 504 may be, for example, a signal from a photosensor indicating detection of a unit of product on a conveyor, a safety device trip, detection of a forklift or human at a part pickup station, a handshaking signal from a first industrial controller to a second industrial controller indicating transfer of a unit of product from a first conveyor controlled by the first industrial controller to a second conveyor controlled by the second industrial controller, or other such events.

In classical parallel simulation, the precise order of simulated events is crucial. However, because the simulations of the sub-models 402 are being executed as separate discrete event simulators that progress through time independently from one another, execution of simulated events may not be synchronized across the separate simulations. That is, simulated events raised on different sub-model simulations and having a common timestamp—indicating that the events occurred simultaneously according to the simulation clock—may execute at different times according to real world time. In the example illustrated in FIG. 5, it is assumed that the simulation of sub-model 2 is executing ahead of the simulation of sub-model 1; that is, at a given point in time, the timestamps of events raised in the sub-model 2 simulation are advanced in time relative to those of the sub-model 1 simulation. Consequently, when the sub-model 1 simulation raises an event 504 that affects the operation of the sub-model 2 simulation, the series of simulated events that occurred in the sub-model 2 simulation after the timestamp associated with the event 502 (the events represented by the grey bars in timing chart 502₂) must be rolled back to the point in time corresponding to event 502. The event 504 is then processed by the sub-model 2 simulation at the correct point in time (corresponding to the timestamp of event 502), and the sub-model 2 simulation restarts from that point in time. For large system simulations with many logical relationships between sub-models, this rollback and replay sequence can occur frequently, and is costly in terms of processing resources. This has discouraged the use of parallelized discrete event simulators.

In contrast to classical simulation, emulation of an automation system—which virtually mimics, in real time, the behavior of the mechanical components that make up the automation system under control of an industrial controller—allows the precise order of event execution to be relaxed for certain logical relationships 306 between objects 304. For example, in the case of an automation system that conveys units of product along a system of conveyors, such as a baggage handling system, the communication of data between two programmable logic controllers (PLCs) that control respective two different conveyor subsections can tolerate a degree of timing error within the emulation, since the real-world PLCs are also likely to experience a degree of variability in the timing of data exchange (e.g., due to jitter, variations in network bandwidth or latency, etc.), and this variability does not negatively impact operation of the system.

Figure 6:
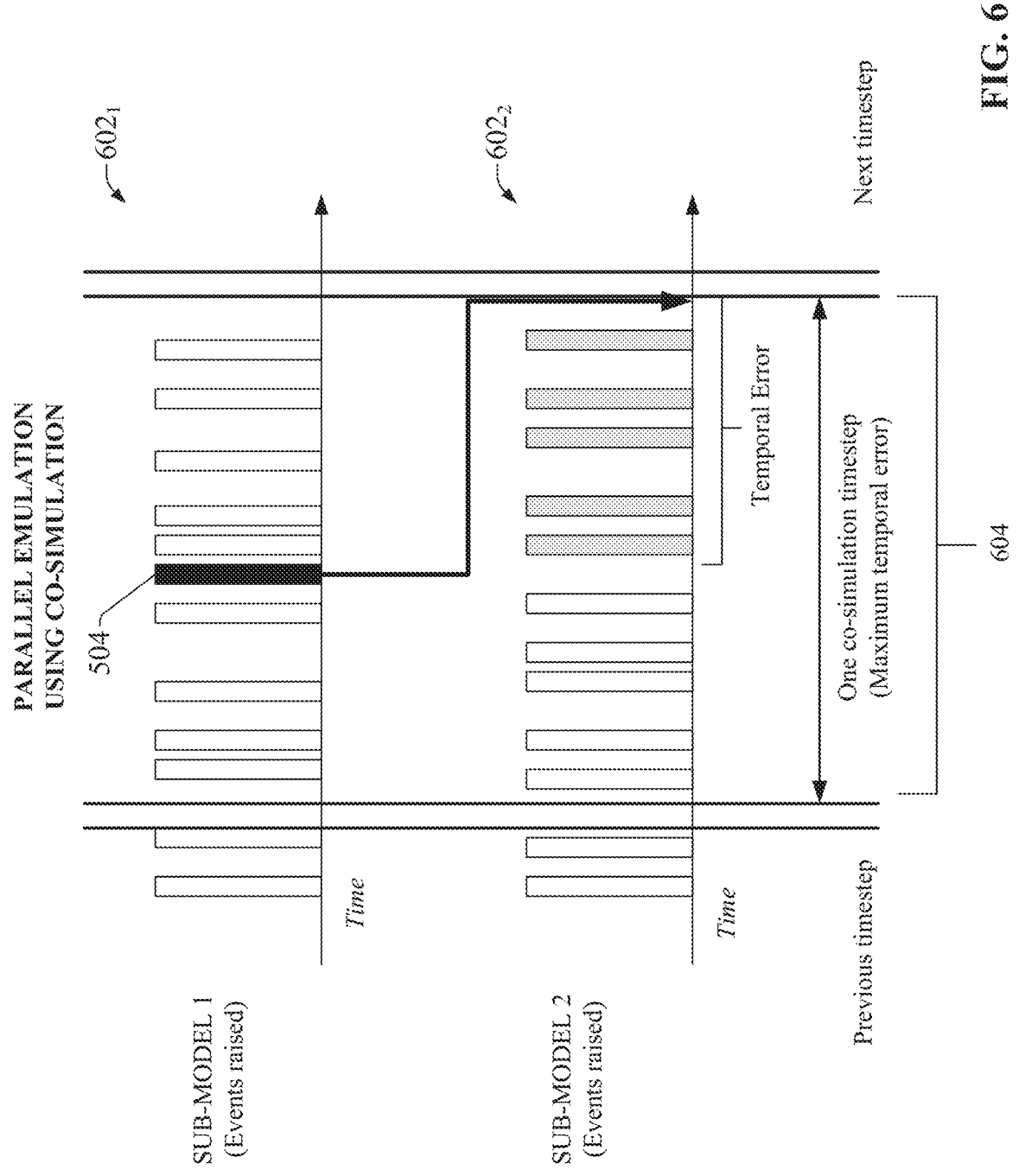
FIG. 6 is a pair of timing diagrams illustrating timings of simulated events that occur on respective two sub-models during co-simulation.

Taking advantage of emulation's ability to tolerate a degree of variability in the ordering of event execution, embodiments of the design and testing system 202 can execute a parallel emulation of an automation system model using co-simulation. FIG. 6 is a pair of timing diagrams 602₁ and 602₂ illustrating timings of simulated events that occur during co-simulation of the sub-models 1 and 2. According to the co-simulation approach, emulations are executed in incremental cycles defined by timesteps 604. When multiple sub-models 402 are emulated using co-simulation, each sub-model simulation is instructed to advance in time by a defined timestep 604 (e.g., 10 milliseconds). Each sub-model simulation executes independently of the other sub-model simulations for the duration of the defined timestep 604. If a sub-model simulation reaches the end of the timestep 604 while other sub-model simulations are still being executed, that simulation is paused until all other sub-model simulations have completed the present timestep 604. When all sub-model simulations have reached the end of the timestep 604, any event data that needs to be communicated between the sub-model simulations is exchanged, thereby synchronizing event data between the sub-model simulations as needed. The sub-model simulations are then restarted for the next timestep 604, completion of which triggers another event data synchronization between the sub-model simulations. As a result of this approach, the event 504 raised in the sub-model 1 simulation does not trigger a rollback of the sub-model 2 simulation to ensure that the event 504 is processed at the exact time corresponding to the timestamp of the event 504 (as in FIG. 5). Instead, processing of the event 504 by the sub-model 2 simulation is deferred to the end of the current timestep 604, even though the event 504 was raised in the middle of the current timestep 604.

Figure 7:
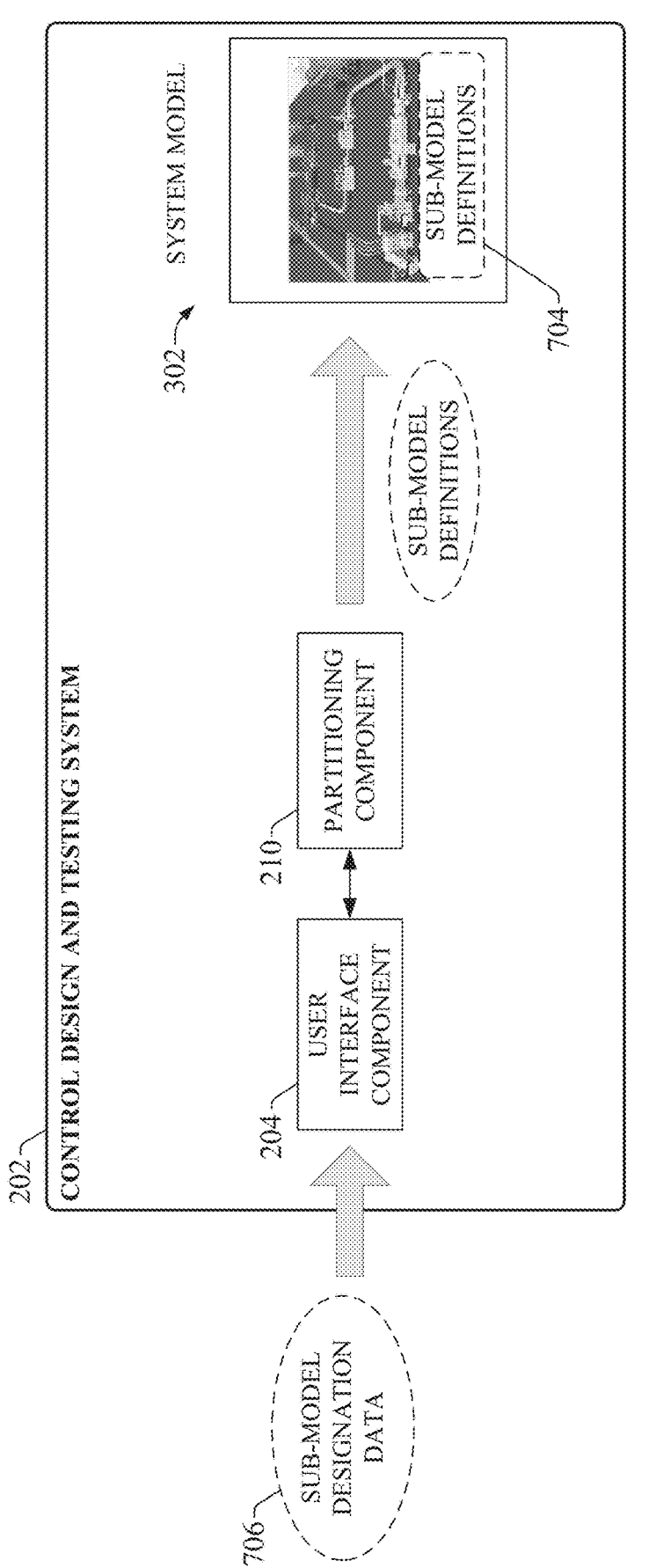
FIG. 7 is a diagram illustrating definition of a model partitioning for a digital model of an industrial automation system to be emulated.

Since events that occur within a sub-model simulation are guaranteed to be synchronized to other sub-models 402 with a temporal error of no greater than the duration of the timestamp 604 defined for the co-simulation, this approach is well suited for parallel emulation of an automation system model that can be partitioned into sub-models 402 whose inter-model event communications can tolerate a temporal error equal to or less than the duration of the timestep 604. Embodiments of the design and testing system 202 include tools that allow a user to define such a partitioning for a given automation system model, or that automatically determine a model partitioning that satisfies the co-simulation criteria. FIG. 7 is a diagram illustrating definition of a model partitioning for a digital model 302 of an industrial automation system to be emulated. In some embodiments, design and testing system 202 may execute on a client device, such as a desktop computer, a laptop computer, a tablet computer, a mobile device, a wearable AR/VR appliance, etc. In other embodiments, system 202 may execute on a cloud platform or another high-level platform accessible to users having authorization to access the system 202. In such embodiments, a client device can remotely access the system's design and emulation tools and leverage these tools to define model partitions and execute a parallel emulation of the resulting sub-models 402 on the cloud platform.

The model 302 can be a digital twin or another type of simulation-capable digital model that serves as a virtual representation of the automation system. As in the examples depicted in FIGS. 3 and 4, the model 302 defines the components of the mechanical automation system as virtualized mathematical objects 304 that model the appearance (in terms of a three-dimensional representation), physics, and behavioral properties of those components. If the automation system represented by the model 302 is designed to handle or convey units of product or other objects, the model 302 can also define behaviors of those units of products in response to simulated actions taken by the automation system. In some design scenarios, the model 302 may also include one or more controller emulators designed to emulate execution of control programs 106 that will be used to monitor and control various portions of the automation system. If the model 302 was developed in another design system, the model 302 can be imported into the design and testing system 202 using the model import component 208 for partitioning and emulation within the system 202. Alternatively, some embodiments of system 202 can include development tools that allow the user to develop the model 302 within the same design and testing environment on which the model 302 will be emulated and tested.

As shown in FIG. 7, a user can submit sub-model designation data 706 via the user interface component 404. This sub-model designation data 706 defines a division of the digital model 302 into sub-models 402 that are to be executed separately on respective different processing nodes, processing spaces, or hardware machines. In some embodiments, in addition to defining the division of the model 302 into sub-models 402, the sub-model designation data 706 may also identify, for each defined sub-model 402 derived from the digital model 302, the target node or processing space on which that sub-model 402 is to be executed. Alternatively, the sub-model designation data 706 may only define the division of the digital model 302, and the model deployment component 212 can select, from among available processing nodes, the target nodes on which the respective defined sub-models 402 will be executed.

The user interface component 204 can support any suitable user interactions for defining the sub-model partitions in various embodiments. For example, in some embodiments the user interface component 204 can render a graphical representation of the digital model 302—comprising a three-dimensional rendering of the automation system—and allow the user to define the sub-model partitions via interaction with this graphical representation (e.g., by selecting the automation system machines, devices, or components that are to be included in each sub-model 402). Based on the sub-model designation data 706 submitted by the user, the partitioning component 210 records the user's selected partitioning as sub-model definition data 704, which is stored with the model 302. This sub-model definition data 704 can subsequently be used by the model deployment component 212 to determine how the digital model 302 should be deployed for parallel emulation using co-simulation.

To ensure that co-simulation can be used to reliably emulate the digital model 302 using parallel emulation, given the maximum temporal error of event communication permitted by co-simulation's timestep 604, the delineation of the digital model 302 should be selected such that the simulated data or event communication between the resulting sub-models 402 (e.g., logical relationships 306) can tolerate temporal errors of up to the duration of the timestamp 604. Users with sufficient knowledge of the automation system represented by the model 302 can selectively delineate the model 302 to satisfy this criterion. In an example scenario in which the automation system comprises multiple separate but interrelated areas that are monitored and controlled by respective different industrial controllers (e.g., a baggage conveyor system in which multiple conveyor networks are controlled by respective PLCs and which pass baggage between the different networks), delineating the digital model 302 such that each resulting sub-model 402 corresponds to one of these areas of control may yield a suitable set of sub-models 402 whose event communications are sufficiently tolerant of timing errors. This is because the exchange of event data between the physical areas of control represented by the sub-models 402—e.g., communication of data between PLCs, receipt of sensor data indicating presence of a new unit of product on a conveyor, etc.—are likely to experience varying degrees of latency in the physical system without negatively affecting performance of the system as a whole.

As an alternative to manual partitioning of the digital model 302, some embodiments of the partitioning component 210 can automatically determine a suitable delineation based on analysis of the digital model 302 and generate the sub-model definition data 704 based on this analysis. In such embodiments, the partitioning component 210 can apply any suitable type of analysis, leveraging industrial domain knowledge, to determine a suitable partitioning of the model 302 that can be reliably emulated using co-simulation.

For example, given a multi-controller automation system, the partitioning component 210 can identify each portion of the automation system that is controlled by an industrial controller and assign that portion of the digital model 302—the industrial controller itself and all devices, machines, or components that are monitored and controlled by the controller—to its own sub-model 402. The partitioning component 210 may also be configured to identify logical relationships 306 between the mathematical objects 304 that make up the model 302, and infer, based on the contexts of the logical relationships 306 (such as the types of objects 304 subject to the logical relationships 306), which of the logical relationships 306 are able to tolerate a maximum temporal error defined by the duration of the co-simulation's timestep 604. In this case, the partitioning component 210 can be configured to classify discovered logical relationships 306 according to the real-world events represented by these relationships 306 (e.g., controller-to-controller communication, sensor-to-controller communication, a physical handling relationship such as a relationship between movement of a conveyor and movement of a unit of product, or other such classifications) and determine a degree of timing criticality of each logical relationship 306 based on its classification. The partitioning component 210 can then generate a suitable delineation of the model 302 based on this information, such that the logical relationships 306 that traverse between the resulting sub-models 402 comprise only relationships 306 that are tolerant of temporal errors (bound by the timestep 602).

Figure 8:
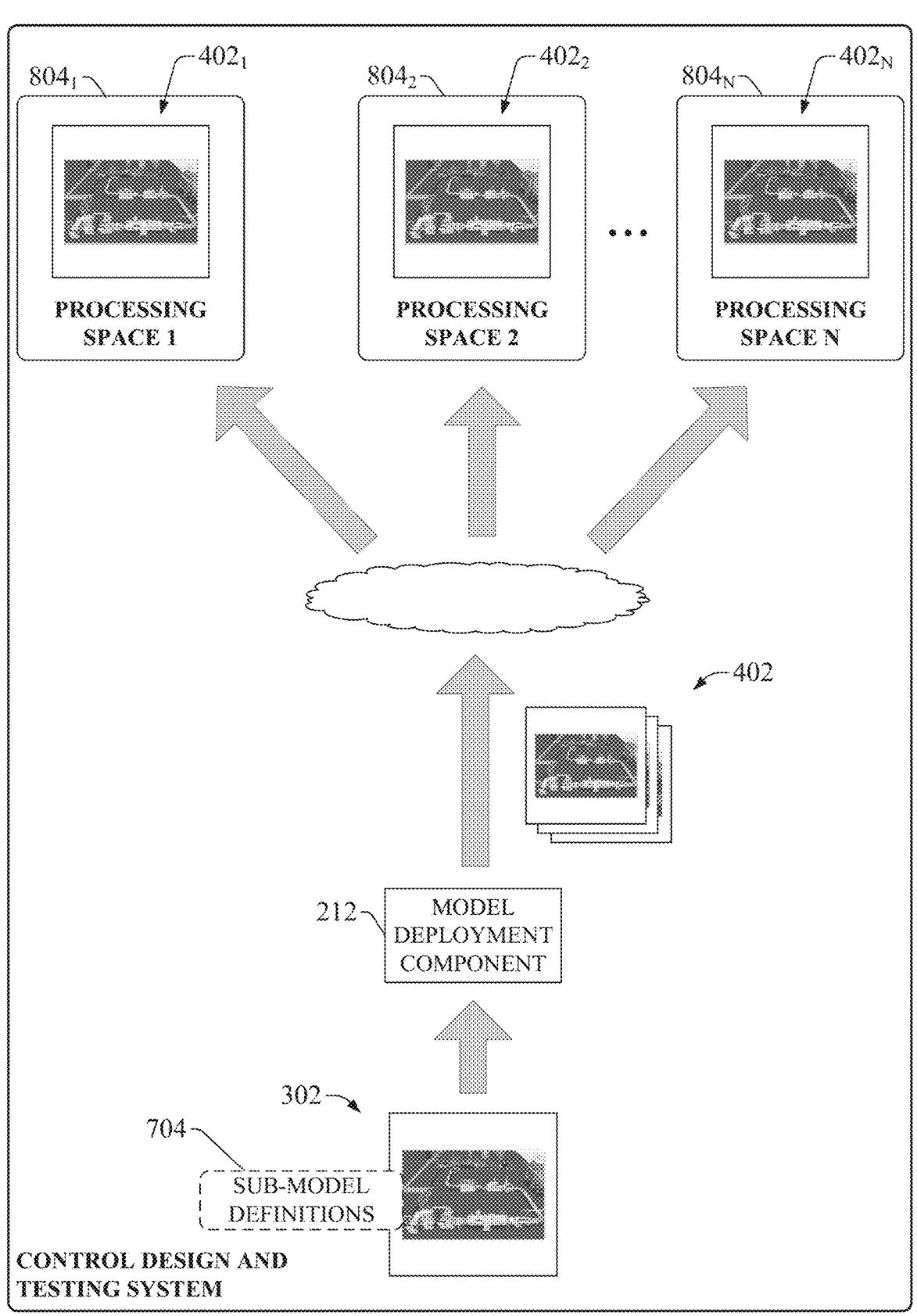
FIG. 8 is a diagram illustrating scaling of a digital model across different processing spaces for parallel emulation.

Once the model delineation has been defined, the system 202 can execute a parallel emulation of the divided digital model 302 using co-simulation. FIG. 8 is a diagram illustrating scaling of the digital model 302 across different processing spaces for parallel emulation. Processing spaces $804_1$-$804_N$ represent different central processing units (CPUs), processing nodes, or hardware machines on which the different sub-models 402 can execute to facilitate parallel emulation of the modeled automation system (where N is a non-zero integer greater than 1). In some scenarios, spaces $804_1$-$804_N$ may be different hardware platforms that are networked together to facilitate data exchange between the spaces. Alternatively, spaces $804_1$-$804_N$ may be separate processing nodes that execute on a cloud platform (e.g., as virtual machines). Based on the sub-model definition data 704, the model deployment component 212 can generate sub-models $402_1$-$402_N$ comprising respective different portions of the digital model 302 as defined by the sub-model definition data 704, and deploy these sub-models $402_1$-$402_N$ to respective processing spaces $804_1$-$804_N$ for parallel emulation. If the processing spaces 804 reside externally to the design and testing system 202, the model deployment component 212 can send the sub-models $402_1$-$402_N$ to their designated spaces $804_1$-$804_N$ over a private network (e.g., an office or plant network) and/or a public network (e.g., the internet) via a secure connection. Alternatively, the system 202 may maintain multiple separate processing spaces (e.g., different CPUs) for execution of separate sub-model emulations within its own hardware environment.

Figure 9:
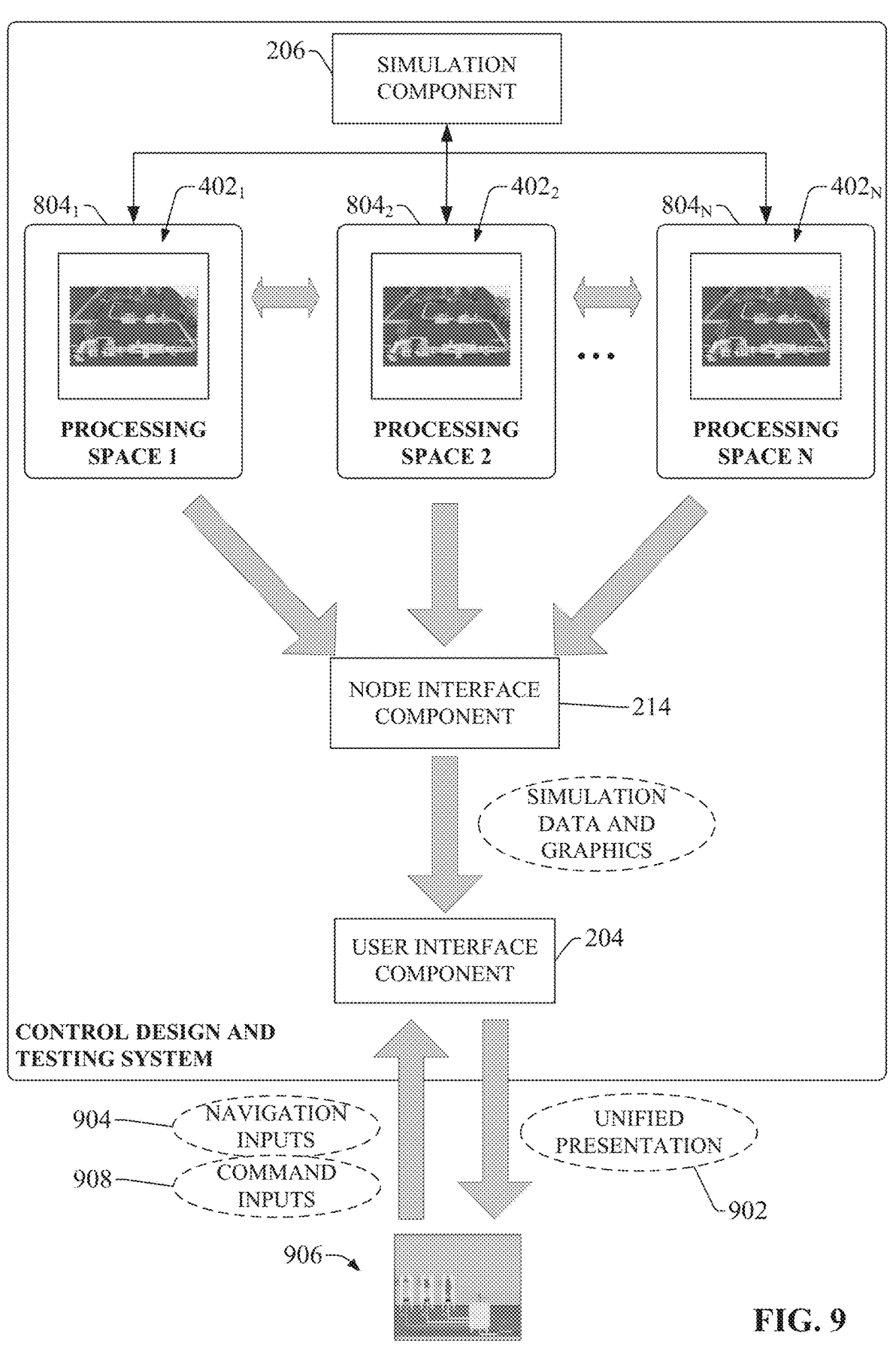
FIG. 9 is a diagram illustrating execution of a parallel emulation and unification of the individual sub-model emulations into a unified 3D view of the emulated system as a whole.

FIG. 9 is a diagram illustrating execution of the parallel emulation and unification of the individual sub-model emulations into a unified 3D view of the emulated system as a whole. Processing spaces $804_1$-$804_N$ are each capable of executing an emulation of its corresponding sub-model $402_1$-$402_N$ independently of the emulations being executed on the other spaces 804, under the management of simulation component 206. Simulation component 206 uses co-simulation techniques (as described above in connection with FIG. 6) to manage this parallel emulation of the sub-models $402_1$-$402_N$. Sequential cycles of the parallel emulation are delineated by timesteps 604 of a defined duration (e.g., 10 milliseconds). For each cycle of this co-simulation technique, each processing space 804 independently advances its sub-model emulation by a single timestep 604 (e.g., 10 ms) then pauses its emulation until all other processing spaces $804_1$-$804_N$ have reached the end of the current timestep 604. When all spaces $804_1$-$804_N$ have advanced their emulations to the end of the present timestep 604, simulated events (e.g., event 504 in FIG. 6) that were raised in any of the processing spaces $804_1$-$804_N$ and that must be communicated to one or more other processing spaces $804_1$-$804_N$ in accordance with the logical relationships 306 between the sub-models $402_1$-$402_N$ are synchronized across the spaces 804 as needed. When this synchronization is complete, the processing spaces $804_1$-$804_N$ are instructed to continue their respective emulations for the next timestep 602. The simulation component 206 manages this parallel emulation by instructing the processing spaces $804_1$-$804_N$ when to pause and restart their emulations, and by synchronizing event data between the spaces $804_1$-$804_N$ at the end of each timestep 604.

The parallel emulation can be driven by one or more industrial control programs 106 (not shown in FIG. 9) executed either by a physical industrial controller or an emulated industrial controller, such that the processing spaces $804_1$-$804_N$ emulate operation of the modeled automation system under control of the industrial control programs 106. In the case of an emulated control program 106, the program 106 may be executed by a virtualized industrial controller that executes on one or more of the processing spaces $804_1$-$804_N$, or may operate on a separate processing space 804 that exchanges simulated monitoring and control signals with one or more of the other spaces $804_1$-$804_N$. In the case of an industrial control program 106 executed by an actual industrial controller, the controller can be networked to the processing spaces $804_1$-$804_N$ to facilitate exchange of simulated response data from the parallel emulation and control signals generated by the industrial controller based on execution of the control program 106.

The design and testing system 202 can present a unified 3D view of the parallel emulation even though the sub-models $402_1$-$402_N$ that make up the emulation are distributed across separate processing spaces $804_1$-$804_N$. To this end, the node interface component 214 can unify graphics from the distributed sub-models $402_1$-$402_N$, and the user interface component 204 can generate unified presentation data 902 representing an aggregation of these unified graphics. The user interface component 204 can render this unified presentation data 902 on a client device as an interactive 3D graphical visualization 906 representing the modeled automation system as a whole, including any appropriate simulation result data (e.g., status indicators, alphanumeric operational information, etc.). Graphical elements of the unified graphical visualization 906 comprise projections of the simulated objects 304 that make up the sub-models $402_1$-$402_N$ onto a single graphical display using a coordinated camera viewpoint, yielding the aggregate visualization 906. For example, the user interface component 204 can project the geometries and materials of the objects 304 in each space to the system's graphics front end, and the graphical rendering of the objects can be implemented by the front end tools. The elements of the aggregate visualization 906 are organized to accurately reflect the arrangements and orientations of the components that make up the physical automation system as defined by the original digital model 302. Since the partitioning of the model 302 requires that each modeled object 304 in each of the sub-models 402 is assigned to a specific space, this spatial information ensures that the projections of the objects to the common visualization 906 will not yield objects that occupy the same geometric space in the simulated world.

In an example implementation, the node interface component 214 can collect simulation data generated by the respective processing spaces $804_1$-$804_N$ based on emulation of their respective sub-models $402_1$-$402_N$. Simulation data from a given processing space 804 represents behaviors and statuses of the virtualized components represented by the sub-model 402 emulated by that space 804, where these behaviors and statuses are based on the control signals generated by any emulated control programs 106 as well as simulated status and behavior data received from other spaces 804 based on emulation of their respective sub-models 402. The node interface component 214 also collects graphical data from the respective processing spaces $804_1$-$804_N$, where the graphical data from a given space 804 comprises an animated 3D representation of the sub-model 402 managed by that space 804. To yield the aggregated view of the composite automation system, the node interface component 316 assembles the graphical data received from all spaces $804_1$-$804_N$ to yield an aggregate 3D visualization 906 of the automation system, and animates the resulting unified visualization 906 in accordance with the emulation data received from the processing spaces $804_1$-$804_N$. This can include animating the movements of the virtualized machines, animating movement of product through the automation system, overlaying simulated status information at appropriate locations within the unified 3D representation, or other such animations. This unified presentation data 902 is sent to a client device to be rendered as visualization 906, which is updated in real-time to reflect the current states of the parallel emulation.

The unified presentation of the parallel emulation can be navigated via interaction with the visualization 906. For example, the user can interact with the visualization 906 to select different viewing angles, zoom distances, or other visualization properties. These interactions are translated into navigation input 904, which is submitted to the user interface component 204. The node interface component 214 then updates the visualization 906 in accordance with the input 904.

In some embodiments, the user can select, via interaction with the visualization 906, a portion of the virtualized automation system that corresponds to one of the sub-models 402 executing on a processing space 804, and in response, the user interface component 204 can update the visualization 906 to render a detailed view of the sub-model 402 selected by the user, where this detailed view is animated based on data from the particular space 804 that manages the selected sub-model 402.

The system 202 can also allow the user to submit, via interaction with the visualization 906, command inputs 908 representing simulated operator interactions with the physical automation system. These simulated operator interactions can include such actions as pressing control buttons (e.g., emergency stop pushbuttons, machine start or stop pushbuttons, etc.), setting position switches that control machine operating modes, tripping safety input devices (e.g., light curtains, safety mats, safety pull cords, etc.), placing units of product or material on a conveyor, removing units from the conveyor, or other such operator interactions. The simulation component 206 processes these command inputs 908 in a manner similar to the handling of events raised in the sub-model emulations (e.g., event 504 in FIG. 6).

Figure 10:
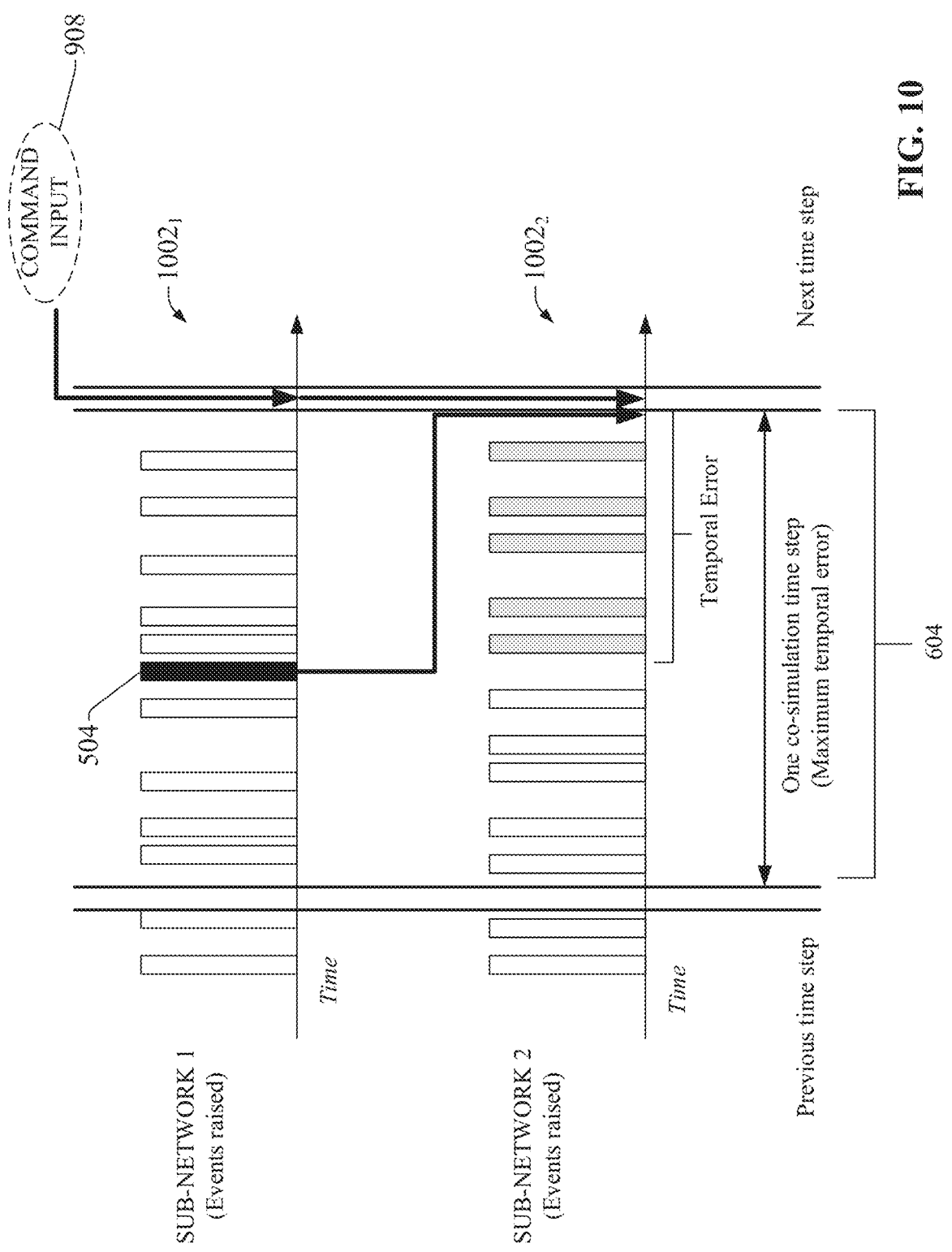
FIG. 10 is a pair of timing diagrams illustrating timings of simulated events and command inputs that occur on respective two sub-models during co-simulation of the sub-models.

FIG. 10 is a pair of timing diagrams $1002_1$ and $1002_2$ illustrating timings of simulated events and command inputs 908 that occur during co-simulation of the sub-models 1 and 2. When the user submits a command input 908 during a timestep 604 for a present co-simulation cycle, the simulation component 206 holds the command input 908 in memory while permitting the sub-model emulations to complete their execution cycles for the present timestep 604. When all processing spaces $804_1$-$804_N$ have advanced their sub-model emulations to the end of the present timestep 604, the simulation component 206 communicates the command input 908 to the one or more sub-model emulations to which the command input 908 was directed for processing. In this way, the command input 908 is synchronized to the appropriate sub-model emulations as part of the same event synchronization step used to synchronize events (such as event 504) across the sub-model emulations. Thus, the system 202 effectively considers both the user and the sub-model emulations as co-simulation slaves whose emulated events and command inputs 908 are to be synchronized across the sub-models upon completion of each timestep 604.

By taking advantage of the relaxed timing requirements of emulation relative to classical simulation, together with the ability of co-simulation to limit temporal errors to the duration of a single timestep 604, the design and testing system 202 described herein can parallelize emulations of large automation systems in a scalable manner using co-simulation and selective partitioning of the digital models 302 representing the automation systems. This approach can accurately emulate large automation systems in a manner that consumes fewer processing and memory resources relative to classical parallel simulation.

FIG. 11 illustrates a methodology in accordance with one or more embodiments of the subject application. While, for purposes of simplicity of explanation, the methodology shown herein is shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 11 illustrates an example methodology 1100 for executing a parallel emulation of an industrial automation system. Initially, at 1102, sub-model designation data is received (e.g., via a user interface of a control design and testing simulation or another type of simulation system) that defines a delineation of a digital model of an automation system into sub-models to be executed on separate processing spaces. In general, the sub-model definitions are selected such that functional interconnections between the resulting sub-models, such as event communications or simulated data exchanges, can tolerate a degree of temporal error in synchronization between the sub-models bounded by a defined co-simulation timestep. The sub-model designation data can be submitted by a user based on the user's manual delineation of the digital model, or can be generated automatically by the design and testing system based on an analysis of the digital model to identify which functional relationships between simulated objects that make up the model can tolerate the degree of temporal error.

At 1104, emulation-capable sub-models are generated in accordance with the sub-model designation data received at step 1102. At 1106, the sub-models generated at step 1104 are deployed to different processing spaces—e.g., different CPUs or processing node devices—for parallel execution of the automation system. At 1108, parallel emulation of the industrial automation system is performed using co-simulation of the sub-models. According to this co-simulation approach, the respective processing spaces emulate their sub-models in sequential incremental timesteps independently of one another. For each cycle of the parallel emulation, the processing spaces advance their respective sub-model emulations for the duration of the present timestep, and when all sub-model emulations have progressed to the end of the present timestep, simulated events that were raised by any of the sub-models during the timestep and that are required by other sub-models are synchronized across the processing spaces as needed. The separate sub-model emulations then continue for the next timestep.

At 1110, emulation and graphics data are obtained from the processing spaces and aggregated into a unified presentation of the industrial automation system. This unified presentation depicts simulated operation of the industrial automation system using an animated three-dimensional graphical representation of the automation system, enhanced by alphanumeric information conveying operational or status information for various machines, devices, or components of the system. At 1112, the three-dimensional presentation is rendered on a client device.

Embodiments, systems, and components described herein, as well as control systems and automation environments in which various aspects set forth in the subject specification can be carried out, can include computer or network components such as servers, clients, programmable logic controllers (PLCs), automation controllers, communications modules, mobile computers, on-board computers for mobile vehicles, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), hard drives, as well as removable memory devices, which can include memory sticks, memory cards, flash drives, external hard drives, and so on.

Similarly, the term PLC or automation controller as used herein can include functionality that can be shared across multiple components, systems, and/or networks. As an example, one or more PLCs or automation controllers can communicate and cooperate with various network devices across the network. This can include substantially any type of control, communications module, computer, Input/Output (I/O) device, sensor, actuator, and human machine interface (HMI) that communicate via the network, which includes control, automation, and/or public networks. The PLC or automation controller can also communicate to and control various other devices such as standard or safety-rated I/O modules including analog, digital, programmed/intelligent I/O modules, other programmable controllers, communications modules, sensors, actuators, output devices, and the like.

The network can include public networks such as the internet, intranets, and automation networks such as control and information protocol (CIP) networks including Device-Net, ControlNet, safety networks, and Ethernet/IP. Other networks include Ethernet, DH/DH+, Remote I/O, Fieldbus, Modbus, Profibus, CAN, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 12:
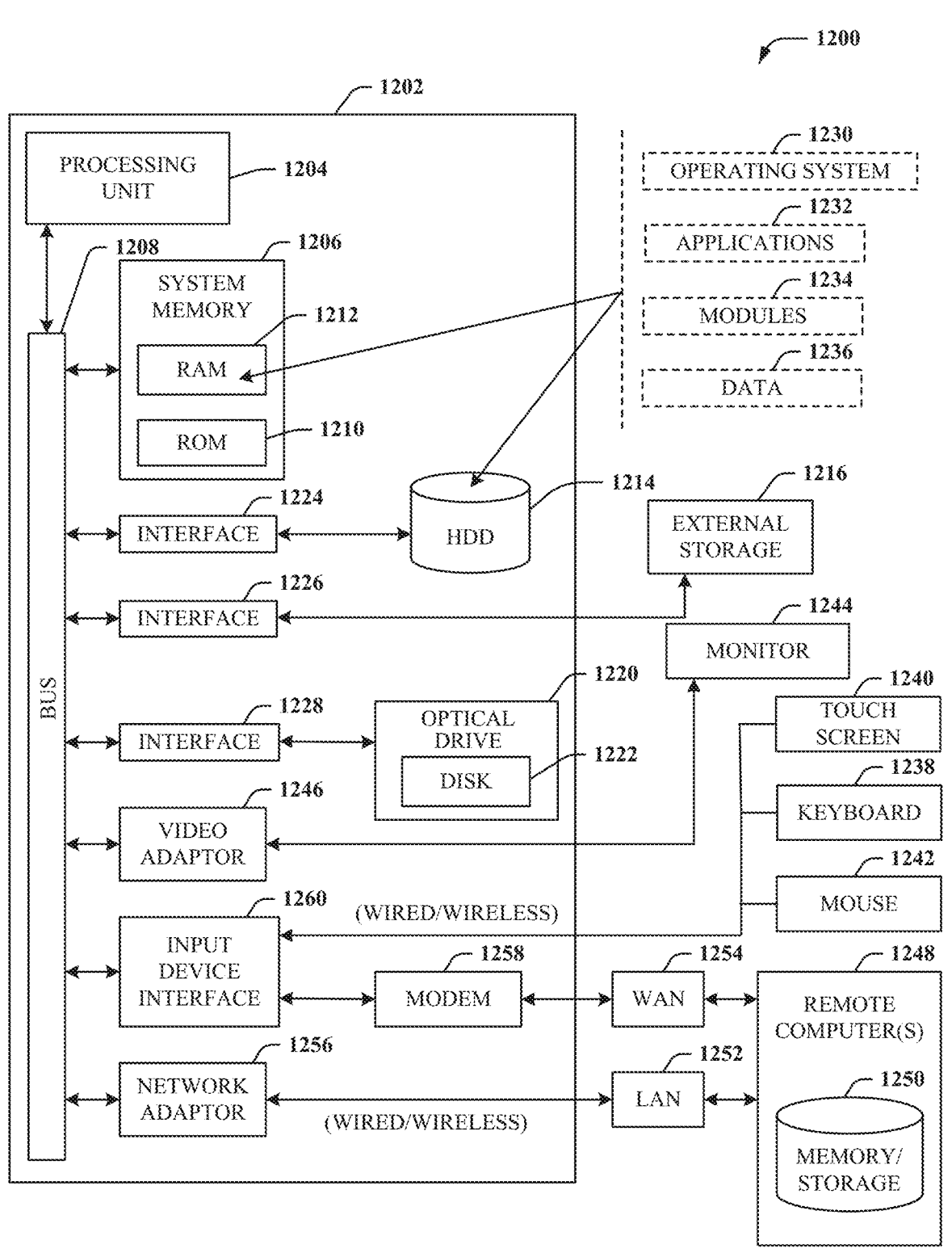
FIG. 12 is an example computing environment.
Figure 13:
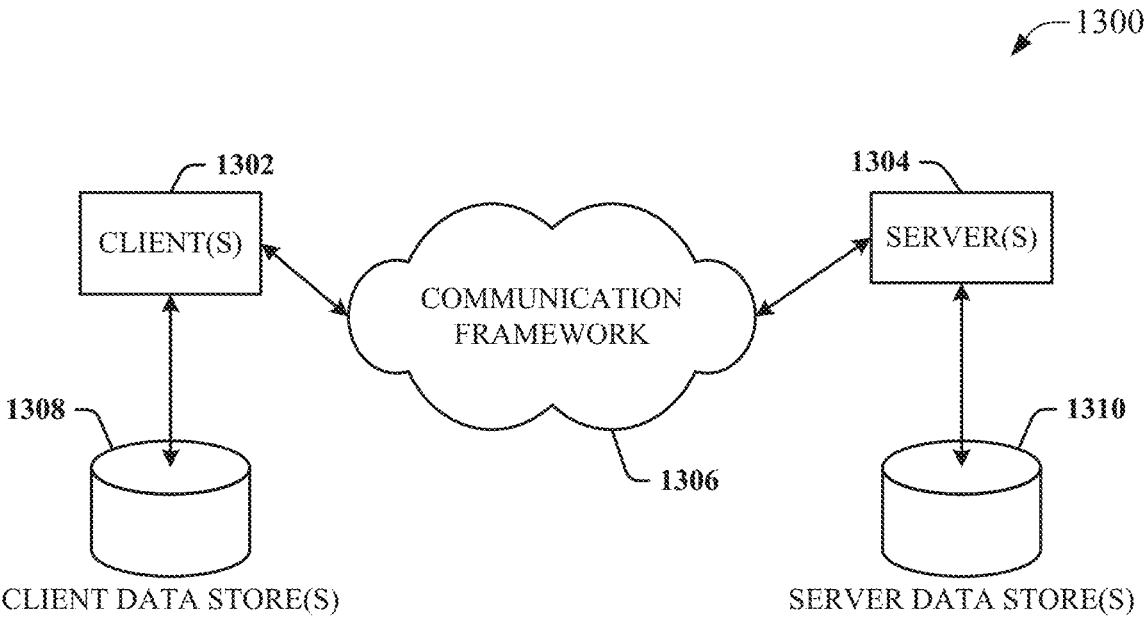
FIG. 13 is an example networking environment.

In order to provide a context for the various aspects of the disclosed subject matter, FIGS. 12 and 13 as well as the following discussion are intended to provide a brief, general description of a suitable environment in which the various aspects of the disclosed subject matter may be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 12, the example environment 1200 for implementing various embodiments of the aspects described herein includes a computer 1202, the computer 1202 including a processing unit 1204, a system memory 1206 and a system bus 1208. The system bus 1208 couples system components including, but not limited to, the system memory 1206 to the processing unit 1204. The processing unit 1204 can be any of various commercially available processors. Dual microprocessors and other multi-processor architectures can also be employed as the processing unit 1204.

The system bus 1208 can be any of several types of bus structure that can further interconnect to a memory bus (with or without a memory controller), a peripheral bus, and a local bus using any of a variety of commercially available bus architectures. The system memory 1206 includes ROM 1210 and RAM 1212. A basic input/output system (BIOS) can be stored in a non-volatile memory such as ROM, erasable programmable read only memory (EPROM), EEPROM, which BIOS contains the basic routines that help to transfer information between elements within the computer 1202, such as during startup. The RAM 1212 can also include a high-speed RAM such as static RAM for caching data.

The computer 1202 further includes an internal hard disk drive (HDD) 1214 (e.g., EIDE, SATA), one or more external storage devices 1216 (e.g., a magnetic floppy disk drive (FDD) 1216, a memory stick or flash drive reader, a memory card reader, etc.) and an optical disk drive 1220 (e.g., which can read or write from a CD-ROM disc, a DVD, a BD, etc.). While the internal HDD 1214 is illustrated as located within the computer 1202, the internal HDD 1214 can also be configured for external use in a suitable chassis (not shown). Additionally, while not shown in environment 1200, a solid state drive (SSD) could be used in addition to, or in place of, an HDD 1214. The HDD 1214, external storage device(s) 1216 and optical disk drive 1220 can be connected to the system bus 1208 by an HDD interface 1224, an external storage interface 1226 and an optical drive interface 1228, respectively. The interface 1224 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1202, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1212, including an operating system 1230, one or more application programs 1232, other program modules 1234 and program data 1236. All or portions of the operating system, applications, modules, and/or data can also be cached in the RAM 1212. The systems and methods described herein can be implemented utilizing various commercially available operating systems or combinations of operating systems.

Computer 1202 can optionally comprise emulation technologies. For example, a hypervisor (not shown) or other intermediary can emulate a hardware environment for operating system 1230, and the emulated hardware can optionally be different from the hardware illustrated in FIG. 12 In such an embodiment, operating system 1230 can comprise one virtual machine (VM) of multiple VMs hosted at computer 1202. Furthermore, operating system 1230 can provide runtime environments, such as the Java runtime environment or the .NET framework, for application programs 1232. Runtime environments are consistent execution environments that allow application programs 1232 to run on any operating system that includes the runtime environment. Similarly, operating system 1230 can support containers, and application programs 1232 can be in the form of containers, which are lightweight, standalone, executable packages of software that include, e.g., code, runtime, system tools, system libraries and settings for an application.

Further, computer 1202 can be enable with a security module, such as a trusted processing module (TPM). For instance with a TPM, boot components hash next in time boot components, and wait for a match of results to secured values, before loading a next boot component. This process can take place at any layer in the code execution stack of computer 1202, e.g., applied at the application execution level or at the operating system (OS) kernel level, thereby enabling security at any level of code execution.

A user can enter commands and information into the computer 1202 through one or more wired/wireless input devices, e.g., a keyboard 1238, a touch screen 1240, and a pointing device, such as a mouse 1242. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1204 through an input device interface 1244 that can be coupled to the system bus 1208, but can be connected by other interfaces, such as a parallel port, an IEEE 1394 serial port, a game port, a USB port, an IR interface, a BLUETOOTH® interface, etc.

A monitor 1244 or other type of display device can be also connected to the system bus 1208 via an interface, such as a video adapter 1248. In addition to the monitor 1244, a computer typically includes other peripheral output devices (not shown), such as speakers, printers, etc.

The computer 1202 can operate in a networked environment using logical connections via wired and/or wireless communications to one or more remote computers, such as a remote computer(s) 1248. The remote computer(s) 1248 can be a workstation, a server computer, a router, a personal computer, portable computer, microprocessor-based entertainment appliance, a peer device or other common network node, and typically includes many or all of the elements described relative to the computer 1202, although, for purposes of brevity, only a memory/storage device 1250 is illustrated. The logical connections depicted include wired/wireless connectivity to a local area network (LAN) 1252 and/or larger networks, e.g., a wide area network (WAN) 1254. Such LAN and WAN networking environments are commonplace in offices and companies, and facilitate enterprise-wide computer networks, such as intranets, all of which can connect to a global communications network, e.g., the Internet.

When used in a LAN networking environment, the computer 1202 can be connected to the local network 1252 through a wired and/or wireless communication network interface or adapter 1256. The adapter 1256 can facilitate wired or wireless communication to the LAN 1252, which can also include a wireless access point (AP) disposed thereon for communicating with the adapter 1256 in a wireless mode.

When used in a WAN networking environment, the computer 1202 can include a modem 1258 or can be connected to a communications server on the WAN 1254 via other means for establishing communications over the WAN 1254, such as by way of the Internet. The modem 1258, which can be internal or external and a wired or wireless device, can be connected to the system bus 1208 via the input device interface 1260. In a networked environment, program modules depicted relative to the computer 1202 or portions thereof, can be stored in the remote memory/storage device 1250. It will be appreciated that the network connections shown are example and other means of establishing a communications link between the computers can be used.

When used in either a LAN or WAN networking environment, the computer 1202 can access cloud storage systems or other network-based storage systems in addition to, or in place of, external storage devices 1216 as described above. Generally, a connection between the computer 1202 and a cloud storage system can be established over a LAN 1252 or WAN 1254 e.g., by the adapter 1256 or modem 1258, respectively. Upon connecting the computer 1202 to an associated cloud storage system, the external storage interface 1226 can, with the aid of the adapter 1256 and/or modem 1258, manage storage provided by the cloud storage system as it would other types of external storage. For instance, the external storage interface 1226 can be configured to provide access to cloud storage sources as if those sources were physically connected to the computer 1202.

The computer 1202 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

FIG. 13 is a schematic block diagram of a sample computing environment 2100 with which the disclosed subject matter can interact. The sample computing environment 1300 includes one or more client(s) 1302. The client(s) 1302 can be hardware and/or software (e.g., threads, processes, computing devices). The sample computing environment 1300 also includes one or more server(s) 1304. The server(s) 1304 can also be hardware and/or software (e.g., threads, processes, computing devices). The servers 1304 can house threads to perform transformations by employing one or more embodiments as described herein, for example. One possible communication between a client 1302 and servers 1304 can be in the form of a data packet adapted to be transmitted between two or more computer processes. The sample computing environment 1300 includes a communication framework 1306 that can be employed to facilitate communications between the client(s) 1302 and the server(s) 1304. The client(s) 1302 are operably connected to one or more client data store(s) 1308 that can be employed to store information local to the client(s) 1302. Similarly, the server(s) 1304 are operably connected to one or more server data store(s) 1310 that can be employed to store information local to the servers 1304.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. A system for emulating industrial automation systems, comprising:
  a memory that stores executable components;
  a processor, operatively coupled to the memory, that executes the executable components, the executable components comprising:
    a partitioning component configured to partition a digital model of an industrial automation system into sub-models;
    a simulation component configured to perform a parallel emulation of the sub-models on respective processing spaces using co-simulation;
    a node interface component configured to aggregate graphical data from the sub-models and simulation data generated by the processing spaces to yield unified presentation data; and
    a user interface component configured to
      render, on a client device, an animated graphical representation of the industrial automation system based on the unified presentation data, and
      receive, during a current timestep of the parallel emulation, command input via interaction with the animated graphical representation, the command input representing a simulated user interaction with the industrial automation system,
    wherein the simulation component is further configured to hold the command input in memory until emulations of the sub-models have advanced to an end of the current timestep, and to synchronize the command input to one or more of the sub-models in response to determining that all of the processing spaces have advanced the emulations of the sub-models to the end of the current timestep.

2. The system of claim 1, wherein the partitioning component is configured to partition the digital model based on sub-model designation data that defines a partitioning of the digital model.

3. The system of claim 2, wherein the user interface component is further configured to render a graphical representation of the digital model and to receive the sub-model designation data via manual interaction with the graphical representation.

4. The system of claim 3, wherein the sub-model designation data further defines, for each sub-model of the sub-models, an identity of a processing space, of the respective processing spaces, to which the sub-model is to be deployed.

5. The system of claim 2, wherein the partitioning component is configured to generate the sub-model designation data based on an analysis of the digital model and a defined partitioning criterion.

6. The system of claim 5, wherein the defined partitioning criterion specifies that the digital model is to be partitioned such that any simulated events that will be communicated between the sub-models in connection with the parallel emulation are tolerant of temporal errors equal to or less than a defined timestep of the co-simulation.

7. The system of claim 1, wherein the executable components further comprise a model deployment component configured to deploy the sub-models to the respective processing spaces.

8. The system of claim 1, wherein the processing spaces execute emulations of the sub-models independently of one another in cycles defined by timesteps, including the current timestep, and
  for a current cycle of the cycles, the simulation component
    instructs the processing spaces to advance the emulations of the sub-models by a duration defined by the current timestep,
    in response to determining that all of the processing spaces have advanced the emulations by the duration defined by the current timestep, synchronizes the command input to the one or more of the sub-models and synchronizes at least one simulated event generated by a first of the sub-models to a second of the sub-models, and
    instructs the processing spaces to restart the emulations of the sub-models for a next timestep.

9. The system of claim 1, wherein the processing spaces comprise separate hardware machines that reside on a common network, separate central processing units, or separate virtual machines that execute on a cloud platform.

10. A method for emulating industrial automation systems, comprising:
  delineating, by a system comprising a processor, a digital model of an industrial automation system into sub-models;
  performing, by the system, a parallel emulation of the sub-models on respective separate processing spaces using co-simulation;
  aggregating, by the system, graphical data obtained from the sub-models and simulation data generated by the separate processing spaces to yield unified presentation data;
  rendering, by the system on a client device, an animated graphical representation of the industrial automation system based on the unified presentation data;
  receiving, by the system during a current cycle of the parallel emulation defined by a timestep, command input via interaction with the animated graphical representation, wherein the command input represents a simulated user interaction with the industrial automation system;
  in response to determining that emulations of the sub-models have not all advanced to an end of the current timestep, holding, by the system, the command input in memory without synchronizing the command input to the sub-models; and
  in response to determining that all of the separate processing spaces have advanced the emulations of the sub-models to the end of the current timestep, synchronizing, by the system, the command input to one or more of the sub-models.

11. The method of claim 10, wherein the delineating comprises delineating the digital model in accordance with sub-model designation data that defines a division of the digital model.

12. The method of claim 11, further comprising rendering, by the system, a graphical representation of the digital model; and receiving, by the system the sub-model designation data via manual interaction with the graphical representation.

13. The method of claim 12, wherein the sub-model designation data further defines, for each sub-model of the sub-models, an identity of a processing space, of the respective separate processing spaces, to which the sub-model is to be deployed.

14. The method of claim 11, wherein the delineating comprises generating the sub-model designation data based on an analysis of the digital model and a defined partitioning criterion.

15. The method of claim 10, further comprising deploying, by the system, the sub-models to the respective separate processing spaces.

16. The method of claim 10, wherein the delineating comprises:

analyzing the digital model to identify logical relationships between modeled objects representing components of the industrial automation system;

determining a subset of the logical relationships that are tolerant of temporal errors equal to or less than a defined timestep of the co-simulation; and delineating the digital model such that logical relationships between the sub-models comprise only logical relationships from the subset of the logical relationships.

17. The method of claim 10, wherein the performing of the parallel emulation comprises:

executing, by the processing spaces, respective emulations of the sub-models independently of one another in cycles, including the current cycle, defined by timesteps, and for the current cycle:

advancing, by the processing spaces, the respective emulations of the sub-models by a duration defined by the current timestep, in response to determining that all of the processing spaces have advanced the respective emulations by the duration defined by the current timestep, synchronizing at least one simulated event generated by a first of the sub-models to a second of the sub-models, and restarting the respective emulations of the sub-models for a next timestep.

18. The method of claim 10, wherein the separate processing spaces comprise separate hardware machines that reside on a common network, separate central processing units, or separate virtual machines that execute on a cloud platform.

19. A non-transitory computer-readable medium having stored thereon instructions that, in response to execution, cause a system comprising a processor to perform operations, the operations comprising:

dividing a digital model of an industrial automation system into sub-models;

performing a parallel emulation of the sub-models on respective separate processing spaces using co-simulation;

aggregating graphical data obtained from the sub-models and simulation data generated by the separate processing spaces to yield unified presentation data;

rendering, on a client device, an animated graphical representation of the industrial automation system based on the unified presentation data;

receiving, during a current cycle of the parallel emulation defined by a timestep, command input via interaction with the animated graphical representation, the command input representing a simulated user interaction with the industrial automation system;

in response to determining that emulations of the sub-models have not all advanced to an end of the current timestep, holding the command input in memory without synchronizing the command input to the sub-models; and in response to determining that all of the separate processing spaces have advanced the emulations of the sub-models to the end of the current timestep, synchronizing the command input to one or more of the sub-models.

20. The non-transitory computer-readable medium of claim 19, wherein the dividing comprises:

analyzing the digital model to identify logical relationships between modeled objects representing components of the industrial automation system;

determining a subset of the logical relationships that are tolerant of temporal errors equal to or less than a duration of a cycle of the co-simulation; and dividing the digital model such that inter-model logical relationships between the sub-models comprise only logical relationships from the subset of the logical relationships.

\* \* \* \* \*